United States Patent
Riley

(10) Patent No.: US 10,209,309 B2
(45) Date of Patent: Feb. 19, 2019

(54) RELAY PROTECTION SYSTEM

(71) Applicant: LITTELFUSE, INC., Chicago, IL (US)

(72) Inventor: James Riley, Everson, WA (US)

(73) Assignee: LITTELFUSE, INC., Chicago, IL (US)

( * ) Notice: Subject to any disclaimer, the term of this patent is extended or adjusted under 35 U.S.C. 154(b) by 346 days.

(21) Appl. No.: 15/132,858

(22) Filed: Apr. 19, 2016

(65) Prior Publication Data

US 2017/0302073 A1   Oct. 19, 2017

(51) Int. Cl.
*H02H 11/00* (2006.01)
*G01R 31/02* (2006.01)
*G01R 31/327* (2006.01)
*H01H 47/00* (2006.01)
*H01H 47/22* (2006.01)

(52) U.S. Cl.
CPC ....... *G01R 31/3278* (2013.01); *G01R 31/025* (2013.01); *H01H 47/002* (2013.01); *H01H 47/22* (2013.01); *H02H 11/005* (2013.01)

(58) Field of Classification Search
CPC ............... H02H 11/001; G01R 31/025; G01R 31/3278; H01H 47/002; H01H 47/22

USPC .......................................................... 361/49
See application file for complete search history.

(56) References Cited

U.S. PATENT DOCUMENTS

| | | |
|---|---|---|
| 1,709,097 A | 4/1929 | Roe |
| 4,432,030 A | 2/1984 | Briccetti |
| 8,139,333 B2 | 3/2012 | Imai et al. |
| 2003/0205937 A1 | 11/2003 | Koos et al. |
| 2014/0177110 A1 | 6/2014 | Curtis et al. |

OTHER PUBLICATIONS

ISR and Written Opinion dated Jun. 21, 2017, in corresponding PCT/US2017/027342.

*Primary Examiner* — Kevin J Comber

(57) ABSTRACT

Provided herein are improved relay protection systems that can detect a short to ground condition on an output of a relay. A relay protection system can bias an output of the relay. The output of the relay can be monitored to determine if a bias level reduces below a predetermined threshold, indicating a short to ground condition. If a short to ground condition is detected, the relay protection system can prevent the relay from transitioning from an open position to a closed position. As a result, a power source can remain decoupled from a load, thereby preventing damage to the relay and the load.

13 Claims, 8 Drawing Sheets

_100_

RELAY PROTECTION SYSTEM

FIELD OF THE DISCLOSURE

This disclosure relates generally to relays, more particularly, to relay protection systems.

BACKGROUND OF THE DISCLOSURE

In many conventional relay systems, a relay transitions from an open position to a closed position to couple a high current and/or a high voltage power source to a load. If an output of the relay is erroneously shorted to ground, then when the relay is closed, the high voltage and/or high current coupled to the relay can severely damage contacts of the relay or can severely damage the load. Because these conventional relay systems transition to a closed position without knowledge of the condition of the output, the risk of significant damage is increased.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Accordingly, there is a need for a relay protection system to provide protection against switching into a short to ground condition.

Various embodiments are generally directed to a relay protection system that can detect a short to ground condition on an output of a relay. The relay protection system can bias an output of the relay. The output of the relay can be monitored to determine if a bias level reduces below a predetermined threshold, indicating a short to ground condition. If a short to ground condition is detected, the relay protection system can prevent the relay from transitioning from an open position to a closed position. As a result, a power source can remain decoupled from a load, thereby preventing damage to the relay or the load.

BRIEF DESCRIPTION OF THE DRAWINGS

By way of example, specific embodiments of the disclosed device will now be described, with reference to the accompanying drawings, in which.

DETAILED DESCRIPTION

Figure 1:
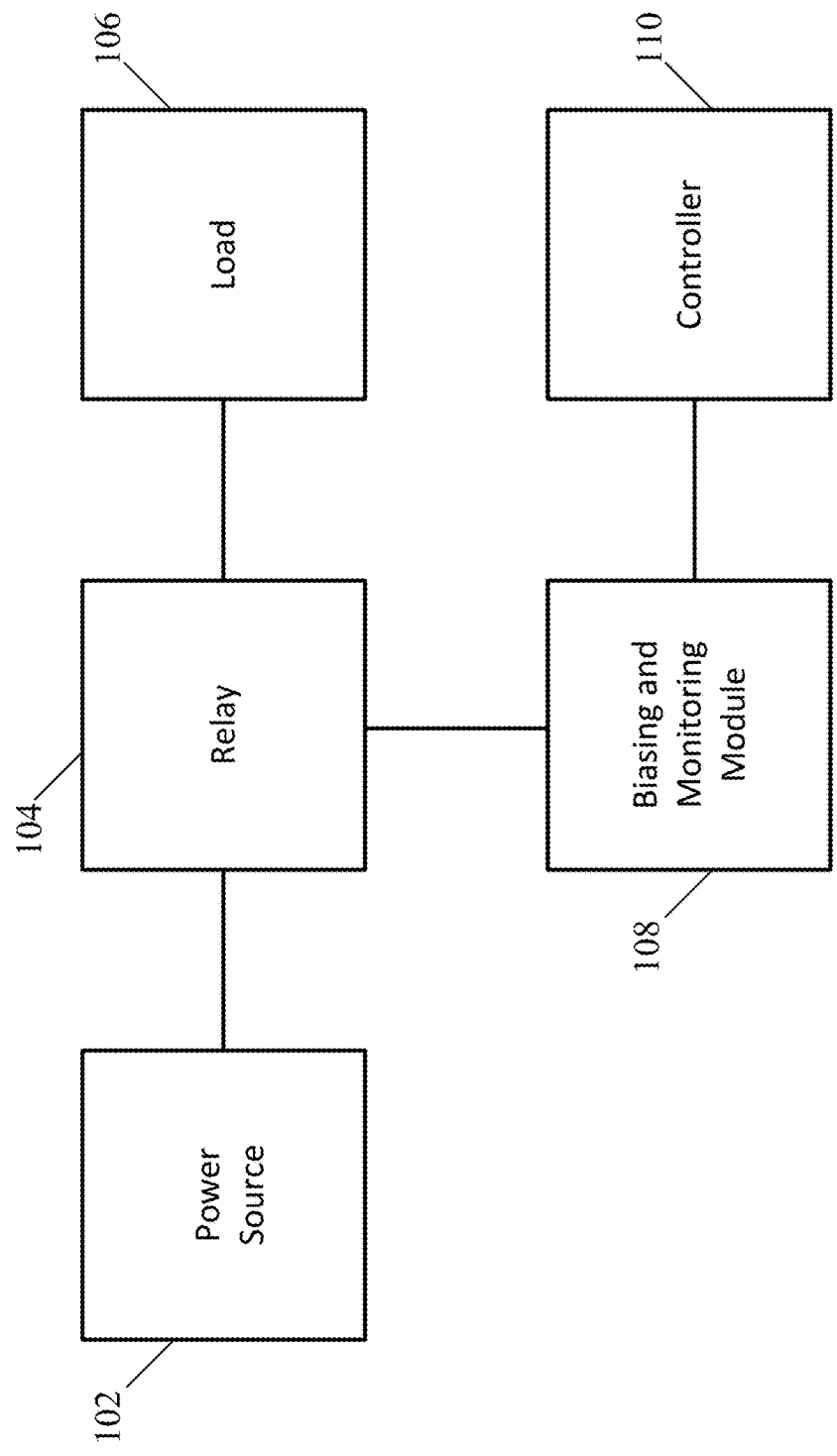
FIG. 1 illustrates an exemplary power distribution and control system.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will fully convey the scope of the disclosure to those skilled in the art. In the drawings, like numbers refer to like elements throughout.

FIG. 1 illustrates an exemplary power distribution and control system 100. The power distribution and control system 100 can include a power source 102, a relay 104, a load 106, a biasing and monitoring module 108, and a controller 110.

The power source 102 can be, for example, a battery. In various embodiments, the power source 102 can be an automobile battery. The load 106 can represent electronic circuits and/or devices downstream from the power source 102. These electronic components, as represented by the load 106, can receive power from the power source 102 during normal operation of the power distribution and control system 100.

The load 106 can be coupled to the power source 102 by the relay 104. As shown in FIG. 1, the relay 104 can be coupled to the power source 102 and the load 106 can be coupled to the relay 104. The relay 104 can be an electromagnetic relay (e.g., an electro-mechanical relay) and/or an electrically operated switch. The relay 104 can operate as a protection relay and/or switch. As an example, the relay 104 can operate to prevent or limit damage to the load 106 upon the occurrence of a fault condition. Fault conditions can include, for example, overvoltage or overcurrent conditions relative to the load 106.

During normal operation, when a fault condition is not detected or occurring, the relay 104 can provide power from the power source 102 to the load 106. When a fault condition is detected or occurs, the relay 104 can decouple the load 106 from the power source 102. During such situations, the relay 104 can disrupt electrical connectivity between the load 106 and the power source 102. As such, the relay 104 can ensure power is provided to the load 106 when an overvoltage or overcurrent condition is not detected or occurring (e.g., when the relay 104 is in a closed positioned) and can isolate and protect the load 106 when an overvoltage or overcurrent condition is detected or occurring (e.g., when the relay 104 is in an open position).

In an initial state of operation of the power distribution and control system 100, the relay 104 can be in an open position or open state such that the power source 102 is not coupled to the load 106. In a subsequent state of operation of the power distribution and control system 100, when it is desired to provide power to the load 106, the relay 104 can be caused to be in a closed position or enter a closed state to couple the power source 102 to the load 106. Normal operation can be considered to be a state when the relay 104 couples the power source 102 to the load 106 during non-fault conditions. During normal operation, the power source 102 can provide a high current and/or a high voltage to the load 106 via the relay 104.

The biasing and monitoring module 108 can be coupled to the relay 104. The biasing and monitoring module 108 can determine when it is possible or desirable for the power distribution and control system 100 to transition from an initial state of operation (e.g., when the relay 104 is in an open position) to a normal state of operation (e.g., when the relay 104 is in a closed position). Specifically, in various embodiments, the biasing and monitoring module 108 can determine if it is safe to couple the power source 102 to the load 106.

In various embodiments, the biasing and monitoring module 108 can determine if an output of the relay 104 is shorted to ground. If the output of the relay 104 is shorted to ground, the biasing and monitoring module 108 can determine that coupling the power source 102 to the load 106 is undesirable since doing so can severely damage the contacts of the relay 104 and/or damage other components of the power distribution and control system 100 (e.g., portions of the load 106). Ground can be a ground voltage such as, for example, approximately zero (0) volts and/or an earth or chassis ground.

In various embodiments, the biasing and monitoring module 108 can also determine if the output of the relay 104 is not shorted to ground. If the output of the relay 104 is not shorted to ground, the biasing and monitoring module 108 can determine that coupling the power source 102 to the load 106 is possible and/or safe since doing so is unlikely to damage the contacts of the relay 104 and/or damage other components of the power distribution and control system 100 (e.g., portions of the load 106).

In various embodiments, the biasing and monitoring module 108 can provide a bias voltage to an output of the relay 104. For example, the biasing and monitoring module 108 can include a biasing arrangement coupled to an output of the relay 104. The biasing arrangement can be monitored to determine if and when the output of the relay becomes shorted to ground (e.g., by monitoring an output of the biasing arrangement coupled to the output of the relay). The bias voltage can be a relatively low voltage. To determine if the output of the relay 104 is shorted to ground, the biasing and monitoring module 108 can monitor and/or detect the bias voltage on the output of the relay 104. In various embodiments, if the biasing and monitoring module 108 determines that the voltage of the relay 104 is approximately at ground or at a voltage lower than the bias voltage, then the biasing and monitoring module 108 can determine that the output of the relay 104 is shorted to ground. Consequently, the relay 104 can be prevented from transitioning from an open position to a closed position as discussed above.

In various embodiments, if the biasing and monitoring module 108 determines that the voltage of the relay 104 is approximately equal to the bias voltage, then the biasing and monitoring module 108 can determine that the output of the relay 104 is not shorted to ground. Consequently, the relay 104 can be allowed to transition from an open position to a closed position as discussed above. The biasing and monitoring module 108 can include one or more components to provide the bias voltage. Further, the biasing and monitoring module 108 can include one or more components to detect, monitor, and/or measure the bias voltage. The components for providing and monitoring the bias voltage can be the same components. The bias voltage can be a direct current (DC) voltage.

The biasing and monitoring module 108 can monitor the bias voltage of the output of the relay 104 periodically, continuously, or randomly. For example, the biasing and monitoring module 108 can be configured to monitor the bias voltage periodically based on a selectable or programmable amount of time or period between monitoring. The biasing and monitoring module 108 can also compare a detected voltage on the output of the relay 104 and can compare it to one or more thresholds. A threshold can be the expected bias voltage or can be a ground. Based on the detected voltage, the biasing and monitoring module 108 can determine if the output of the relay 104 is likely shorted to ground or likely not shorted to ground. The bias and monitoring module 108 can include a memory for storing one or more threshold values. The memory of the biasing and monitoring module 108 can also store detected voltages (e.g., to maintain a log or history of detected voltages over time).

When it is determined that the output of the relay 104 is likely shorted to ground (e.g., when the detected voltage is below a threshold voltage approximately equal to the expected bias voltage), the biasing and monitoring module 108 can generate a first signal. The first signal can be provided to the controller 110. The first signal can indicate that the output of the relay 104 is shorted to ground or likely shorted to ground (e.g., by indicating that the detected or measured voltage is below one or more predetermined thresholds).

When it is determined that the output of the relay 104 is likely not shorted to ground (e.g., when the detected voltage is not below a threshold voltage approximately equal to the expected bias voltage), the biasing and monitoring module 108 can generate a second signal. The second signal can also be provided to the controller 110. The second signal can indicate that the output of the relay 104 is not shorted to ground or likely not shorted to ground (e.g., by indicating that the detected or measured voltage is above one or more predetermined thresholds or approximately equal to the expected bias voltage).

The controller 110 can control and monitor operation of the power distribution and control system 100. For example, the controller 110 can control operation of the relay 104. Specifically, the controller 110 can control when the relay 104 provides electrical connectivity between the power source 102 and the load 106 and when the relay 104 is to decouple the load 106 from the power source 102.

The controller 110 can control the relay 104 based on the receipt of signals from the biasing and monitoring module 108. For example, upon receipt of a signal (e.g., the first signal) from the biasing and monitoring module 108 that the output of the relay 104 is shorted to ground, the controller 110 can determine to prevent or block the relay 104 from transitioning from an open state to a closed state. That is, the controller 110 can ensure that the relay 104 does not enter a closed position and attempt to couple the power source 102 to the load 106. In this way, damage to the relay 104 and/or the load 106 can be prevented.

Upon receipt of a signal (e.g., the second signal) from the biasing and monitoring module 108 that the output of the relay 104 is not shorted to ground, the controller 110 can determine to allow or enable the relay 104 to transition from an open state to a closed state. That is, the controller 110 can allow the relay 104 to enter a closed position so as to couple the power source 102 to the load 106. In this way, normal operation of the power distribution and control system 100 can be provided, after a check of a short to ground condition is made.

When the controller 110 determines to prevent or block the relay 104 from transitioning from an open state to a closed state based on receipt of a signal from the biasing and monitoring module 108 (e.g., based upon receipt of the first signal described above), the controller 110 can also generate or provide an alarm signal. The alarm signal can be a visual and/or an audible signal. The alarm signal can alert a user, for example, that the output of the relay 104 is shorted to ground. In general, the alarm signal can indicate the power distribution and control system 100 is not operating under a normal or safe condition. The controller 110 can further block or prevent other operations of the power distribution and control system 100.

As an alternative or in addition thereto, any signal generated by the biasing and monitoring module 108 based on monitoring of the output of the relay 104 can directly control the relay 104 (e.g., can prevent the relay 104 from closing) or can include an audible and/or visual alarm signal.

In various embodiments, the controller 110 can be a microprocessor. In various embodiments, the controller 110 can be an engine control unit (ECU) and the biasing and monitoring module 108 can provide any generated signal to the controller 110 over a controller area network (CAN) or local interconnect network (LIN).

The biasing and monitoring module 108 can include one or circuits and can be implemented in hardware, software, or any combination thereof. The biasing and monitoring module 108 and the controller 110, or any portion thereof, can be considered to be part of a relay protection system.

Figure 2:
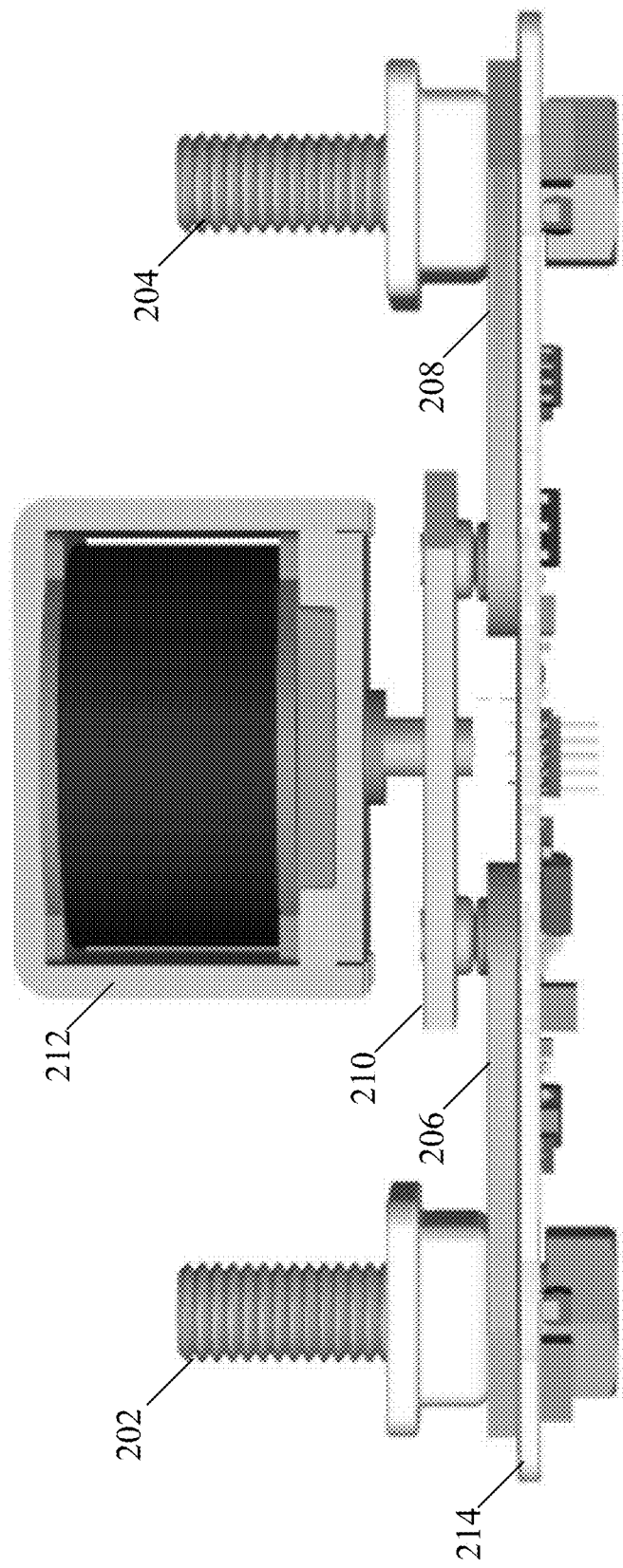
FIG. 2 illustrates an exemplary relay and biasing and monitoring system.

FIG. 2 illustrates an exemplary relay and biasing and monitoring system 200. The relay and biasing and monitoring system 200 can include portions of a relay (e.g., the relay 104) and a biasing and monitoring module (e.g., the biasing and monitoring module 108). As shown in FIG. 2, the relay and biasing and monitoring system 200 can include an input connection or stud 202 and an output connection or stud 204. The input stud 202 can be connected to a first portion or component of a power supply (e.g., the power source 102). The output stud 204 can be connected to a first portion or component of a load (e.g., the load 106).

As further shown in FIG. 2, the relay and biasing and monitoring system 200 can include a first stationary conductor or bus bar 206 and a second stationary conductor or bus bar 208. The bus bar 206 can be coupled to the input stud 202 and the bus bar 208 can be coupled to the output stud 204. A moveable bus bar or conductor 210 can be coupled between the bus bar 206 and the bus bar 208.

The moveable bus bar or contact 210 can determine electrical connectivity between the bus bar 206 and the bus bar 208. During normal operation of the relay and biasing and monitoring system 200, a current (e.g., the current of the relay 104) can flow from the input stud 202, through the bus bar 206, through the moveable conductor 210, through the bus bar 208, and to the output stud 204. When an overvoltage or overcurrent condition is detected or occurs, the moveable conductor 210 can be disconnected from the bus bar 206 and the bus bar 208, thereby disrupting the flow of current from the input stud 202 to the output stud 204. As an example, the moveable conductor 210 can move in a vertical direction (relative to the orientation of the current monitoring system 200 as depicted in FIG. 2) so as to become disconnected from the bus bar 206 and the bus bar 208.

Prior to a normal operational state of the relay and biasing and monitoring system 200, the moveable conductor 210 can be disconnected from the bus bar 206 and the bus bar 208. Once it is determined that an output of the relay is not shorted to ground (e.g., the output stud 204), then the moveable conductor 210 can be coupled to the bus bar 206 and the bus bar 208.

The relay and biasing and monitoring system 200 can further include a solenoid or coil 212. Additionally, the relay and biasing and monitoring system 200 can include a printed circuit board (PCB) 214 upon which constituent components of the relay and biasing and monitoring system 200 can be mounted. The input stud 202, the output stud 204, the bus bar 206, the bus bar 208, the moveable conductor 210, and the solenoid can form a portion of a relay (e.g., the relay 104). In various embodiments, these components can form a portion of a main disconnect coupled to a power source such as, for example, a battery (e.g., an automobile battery).

The output stud 204 can represent an output of the relay 104. As described above, a bias voltage can be applied to the output stud 204 and can be monitored to determine if the output stud 204 is shorted to ground or not. Components for providing, applying, and monitoring any bias voltage can be provided as part of the relay and biasing and monitoring system 200 (e.g., coupled to the PCB 214). For example, the relay and biasing and monitoring system 200 can include all or a portion of the biasing and monitoring module 108. The relay and biasing and monitoring system 200 can represent all or a portion of the relay 104 and the biasing and monitoring nodule 108 as depicted in FIG. 1 but is not so limited. That is, the relay/circuit protection components and functions of the relay and biasing and monitoring system 200 and the biasing and monitoring components and functions of the relay and biasing and monitoring system 200 can be separated and not combined and arranged on the same PCB as depicted in FIG. 2.

Figure 3:
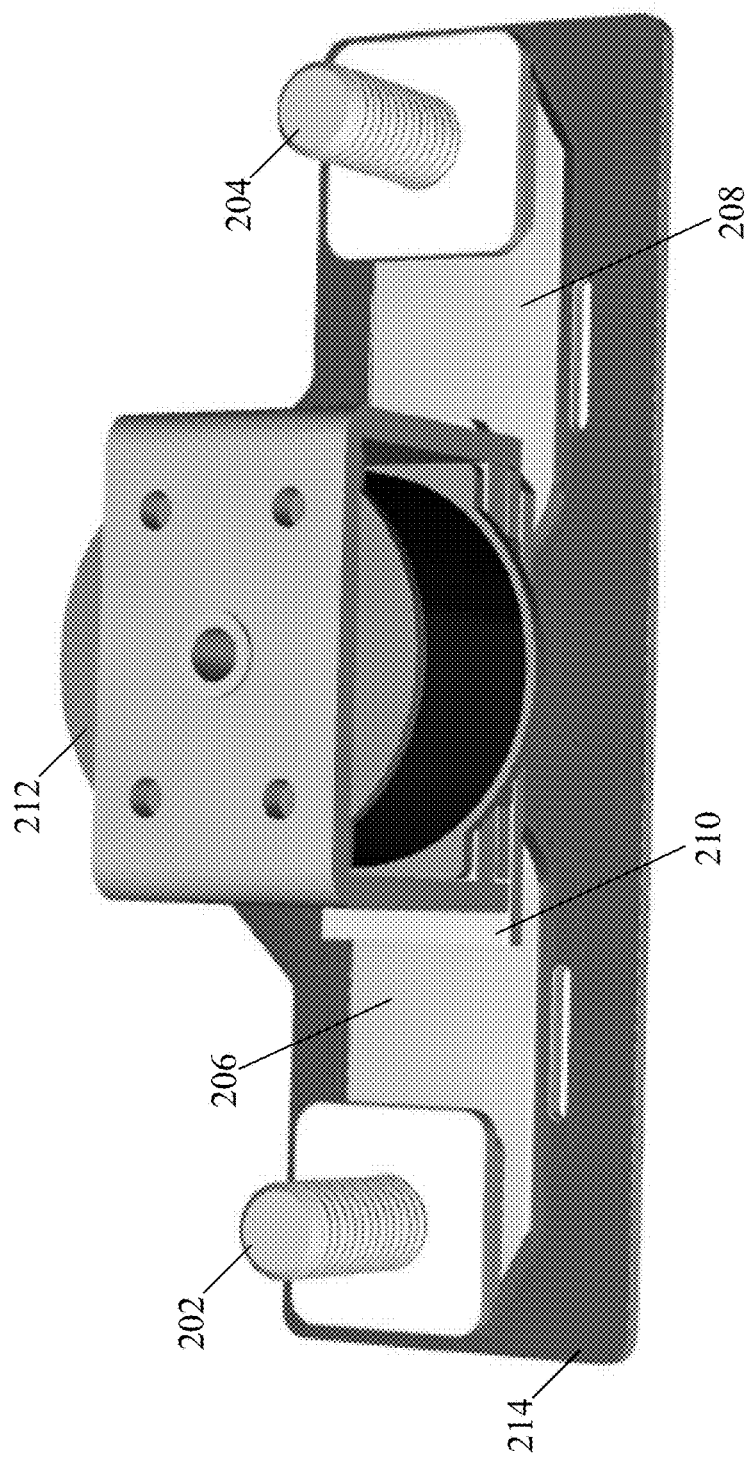
FIG. 3 illustrates a first perspective view of the relay and biasing and monitoring system depicted in FIG. 2.
Figure 4:
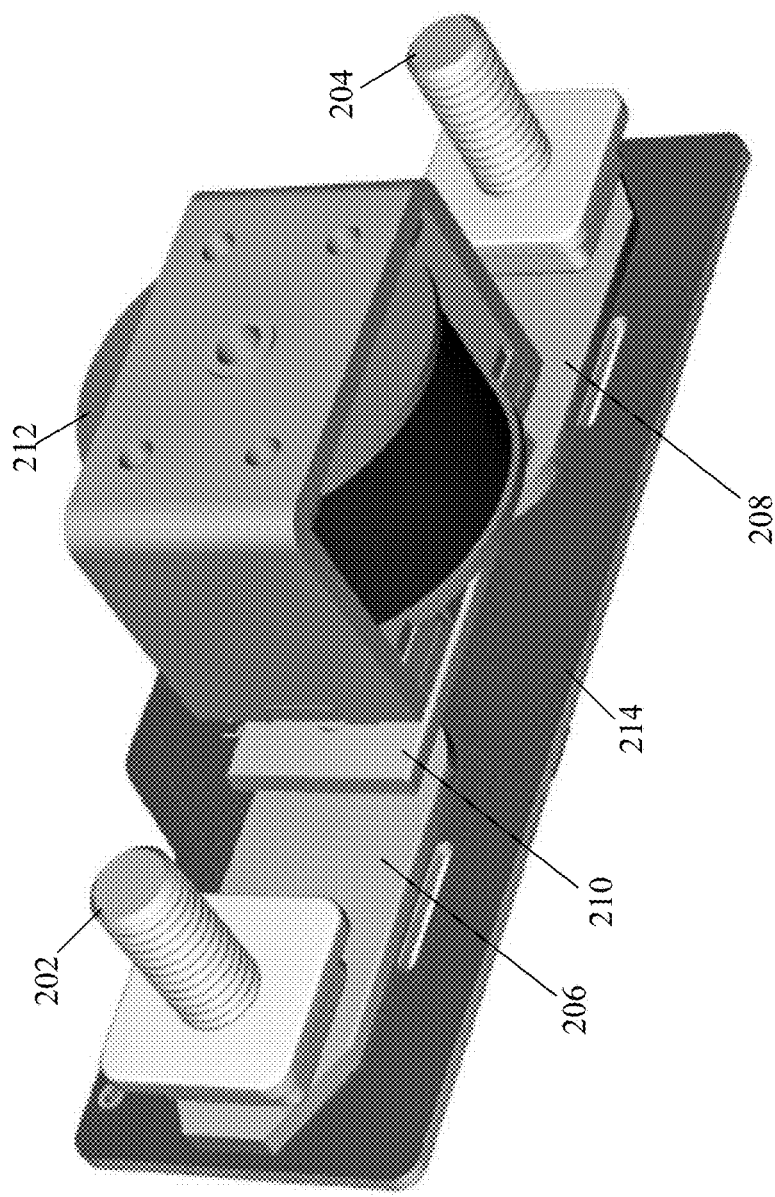
FIG. 4 illustrates a second perspective view of the relay and biasing and monitoring system depicted in FIG. 2.

FIGS. 3-6 illustrate the relay and biasing and monitoring system 200 in a variety of views. For example, FIG. 3 illustrates a first perspective view of the exemplary relay and biasing and monitoring system 200 and FIG. 4 illustrates a second perspective view of the exemplary relay and biasing and monitoring system 200. FIGS. 3 and 4 are provided to illustrate an exemplary arrangement of the input stud 202, the output stud 204, the bus bar 206, the bus bar 208, the moveable conductor 210, the solenoid or coil 212, and the PCB 214.

Figure 5:
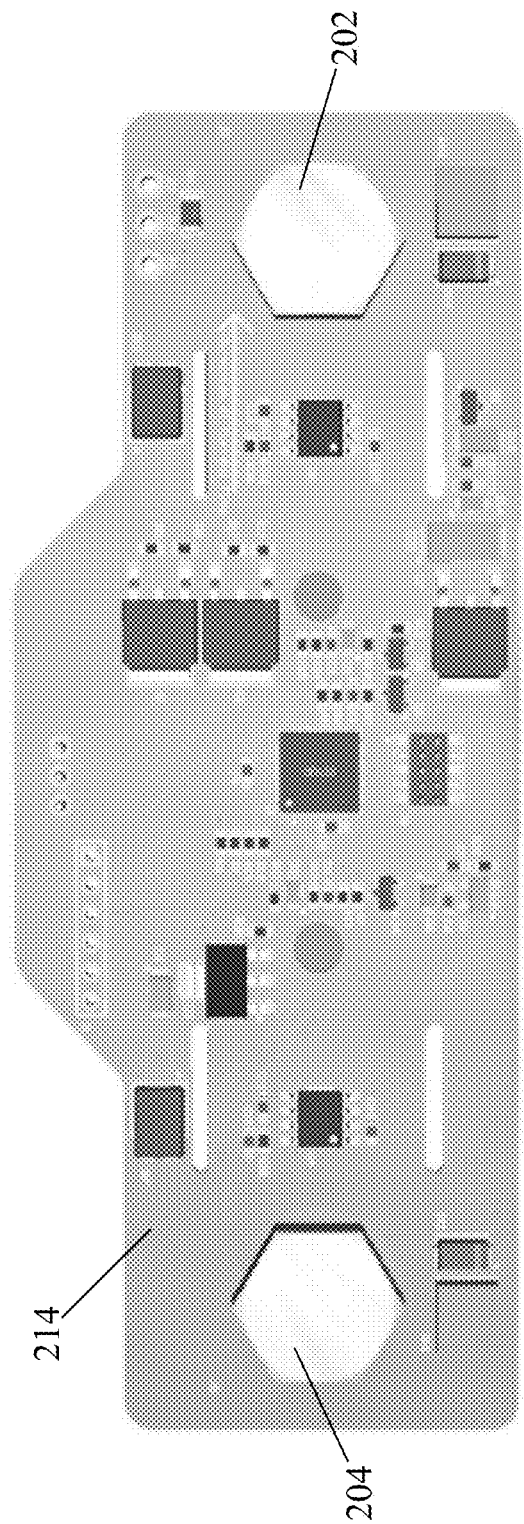
FIG. 5 illustrates a bottom view of the relay and biasing and monitoring system depicted in FIG. 2.
Figure 6:
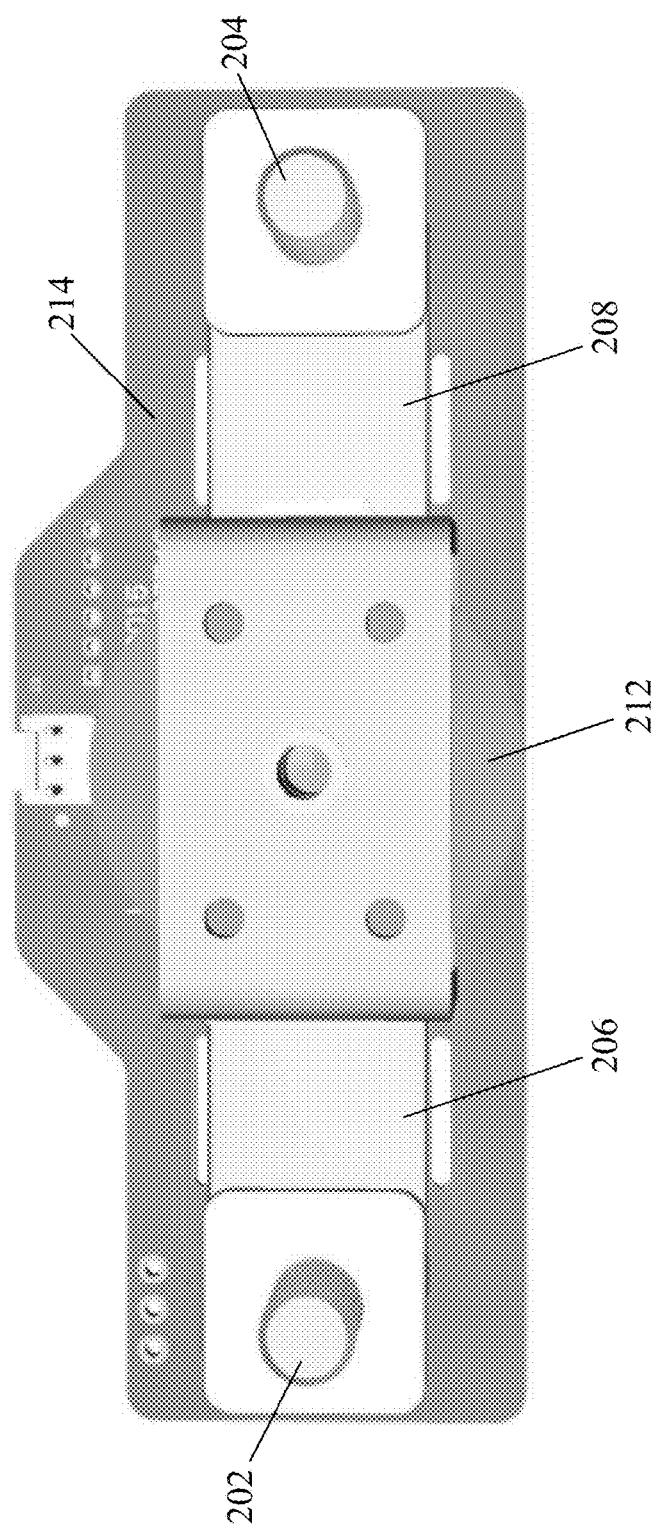
FIG. 6 illustrates a top view of the relay and biasing and monitoring system depicted in FIG. 2.

FIG. 5 illustrates a bottom view of the relay and biasing and monitoring system 200. FIG. 6 illustrates a top view of the relay and biasing and monitoring system 200. Again, FIG. 5 and FIG. 6 illustrate exemplary arrangements of the solenoid 212, the bus bar 206, the bus bar 208, the input stud 202, and the output stud 204 on the PCB 214.

Figure 7:
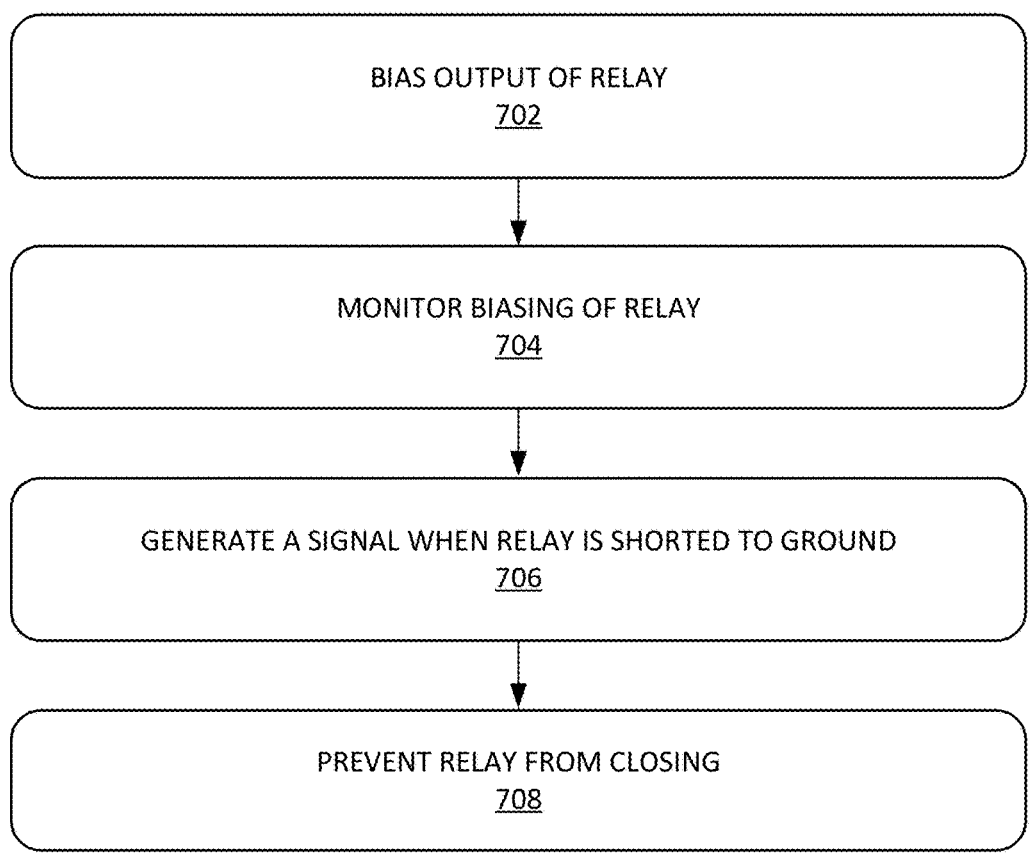
FIG. 7 illustrates an exemplary flow diagram for a method for monitoring an output of a relay.

FIG. 7 illustrates an exemplary flow diagram for a method for monitoring an output of a relay 700. The method illustrated in FIG. 7 can be implemented using the power distribution and control system 100 and/or the relay and biasing and monitoring system 200.

At step 702, an output of a relay can be biased. The output of the relay can be an output stud of the relay. The output of the relay can be provided with a bias voltage. For example, a biasing arrangement can be coupled to the output of the relay. The bias voltage can be a relatively low bias voltage.

At step 704, the biasing of the relay can be monitored. The output of the relay can be monitored to detect or measure a bias voltage of the output of the relay. For example, an output of the biasing arrangement coupled to the output of the relay can be monitored to effectively monitor the output of the relay. The output of the relay can be periodically, continuously, or randomly monitored to measure or detect a bias voltage of the output of the relay. As part of the monitoring, the detected bias voltage of the relay can be compared to one or more predetermined thresholds.

At step 706, a signal can be generated when the output of the relay is shorted to ground. The output of the relay can be determined to be shorted to ground when the monitored voltage of the output of the relay (or biasing arrangement) is below a predetermined threshold (e.g., the bias voltage) or is approximately equal to ground. The generated signal can indicate that the output of the relay is shorted to ground (or likely is shorted to ground). The generated signal can be provided to a microprocessor or a controller.

At step 708, the relay can be prevented from closing. Specifically, the relay can be prevented from transitioning from an open position to a closed position, thereby preventing a power source from coupling to a load via the relay. In doing so, damage to the relay and/or the load can be avoided due to the shorted condition of the relay. Further, at step 708, an alarm signal can be generated to indicate that the output of the relay is shorted to ground. The alarm signal can be an audible and/or a visual signal.

Figure 8:
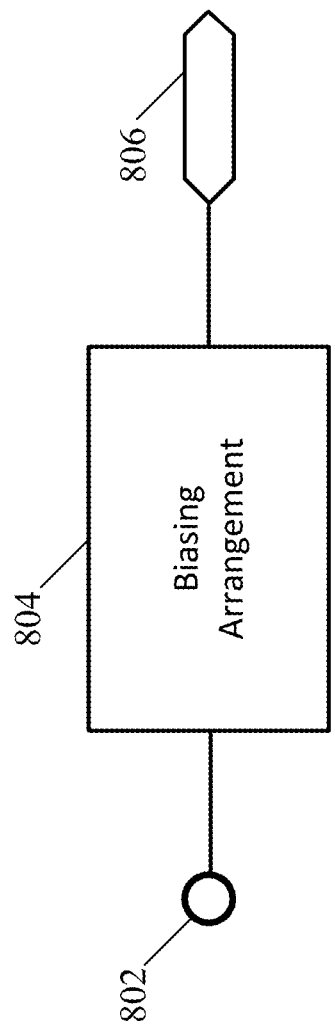
FIG. 8 illustrates an exemplary biasing and monitoring system.

FIG. 8 illustrates an exemplary biasing and monitoring system 800. The biasing and monitoring system 800 can be used as part of the power distribution and control system 100 and/or the relay and biasing and monitoring system 200 and can implement part of the method for monitoring an output of a relay 700.

As shown in FIG. 8, the biasing and monitoring system 800 can include a connector 802, a biasing arrangement 804, and a connector 806. The connector 802 can be coupled to an output of a relay (e.g., an output of the relay 104 or the output stud 204). The connector 806 can be coupled to a controller (e.g., the controller 110). The biasing arrangement 804 can be an arrangement of one or more circuit components for biasing an output of a relay.

In various embodiments, the biasing arrangement 804 can apply a relatively low bias voltage to the output of the relay via the connector 802. When the relay is not shorted to ground, a signal indicating as much can be provided to the controller by way of the connector 806. For example, a signal representative of the applied bias voltage can be provided to the connector 806. When the relay is shorted to ground, a signal indicating the same can also be provided to the controller by way of the connector 806. For example, a low voltage (e.g., 0 V) signal can be sensed or provided at the connector 806 and provided to the controller.

The biasing arrangement can be implemented in hardware using internal circuitry and voltages available within a larger system that the biasing and monitoring system 800 operates within or as a part of.

The techniques described herein for relay protection can be applied to other circuit systems including, but not limited to, power distribution modules, battery switches, and fuse blocks. The techniques disclosed herein can reduce the likelihood of damaging circuit components caused by closing into a short to ground situation by providing the ability to detect such a situation and responding appropriately to avoid any damage that could be caused by a short to ground condition.

While the present disclosures references certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. An apparatus, comprising:
a power source;
a relay coupled to the power source;
a load coupled to the relay, wherein the relay couples the load to the power source when the relay is in a closed position;
a biasing and monitoring module coupled to the relay; and
a controller coupled to the biasing and monitoring module, wherein the biasing and monitoring module determines when an output of the relay is shorted to ground by detecting a voltage on the output of the relay;
wherein the biasing and monitoring module provides a bias voltage to the output of the relay;
wherein the biasing and monitoring module determines the output of the relay is not shorted to ground when the detected voltage on the output of the relay is equal to the bias voltage, and wherein the biasing and monitoring module generates a signal indicating the output of the relay is not shorted to ground and provides the signal to the controller when the detected voltage on the output of the relay is equal to the bias voltage.

2. The apparatus of claim 1, wherein the controller causes the relay to be placed into the closed position upon receipt of the signal indicating the output of the relay is not shorted to ground.

3. The apparatus of claim 1, wherein the power source is a battery.

4. The apparatus of claim 3, wherein the battery is an automobile battery.

5. The apparatus of claim 1, wherein the controller is a microprocessor.

6. The apparatus of claim 1, wherein the controller is an engine control unit (ECU).

7. The apparatus of claim 1, wherein the biasing and monitoring module determines the output of the relay is shorted to ground when the detected voltage on the output of the relay is equal to a ground voltage.

8. The apparatus of claim 7, wherein the ground voltage is equal to zero (0) volts.

9. The apparatus of claim 7, wherein the biasing and monitoring module generates a signal indicating the output of the relay is shorted to ground and provides the signal to the controller when the detected voltage on the output of the relay is equal to the ground voltage.

10. The apparatus of claim 9, wherein the controller causes the relay to remain in an open position upon receipt of the signal indicating the output of the relay is shorted to ground.

11. The apparatus of claim 10, wherein the controller generates an alarm signal indicating the output of the relay is shorted to ground.

12. The apparatus of claim 11, wherein the alarm signal is a visual alarm.

13. The apparatus of claim 11, wherein the alarm signal is an audible alarm.

* * * * *